United States Patent [19]

Cox

[11] Patent Number: 4,885,488
[45] Date of Patent: Dec. 5, 1989

[54] MINIATURIZED FAN FOR PRINTED CIRCUIT BOARDS

[75] Inventor: Ned Cox, Jonesborough, Tenn.

[73] Assignee: Texas Instruments Incorporated, Dallas, Tex.

[21] Appl. No.: 197,224

[22] Filed: May 23, 1988

[51] Int. Cl.⁴ .......................... H02K 29/08; H02K 5/04
[52] U.S. Cl. ...................................... 310/68 R; 310/42;
 310/63; 310/89; 417/423.7; 361/384
[58] Field of Search ................. 310/62, 63, 67 R, 268,
 310/68 R, 42, 89; 361/383, 384; 415/10, 203,
 204, 206; 417/423.7, 424.2, 352

[56] References Cited

U.S. PATENT DOCUMENTS

| | | | |
|---|---|---|---|
| 4,620,139 | 10/1986 | Egami et al. | 310/68 R |
| 4,633,110 | 12/1986 | Genco et al. | 310/68 R |
| 4,668,884 | 5/1987 | Amao et al. | 310/268 |

OTHER PUBLICATIONS

Antonetti, "Air Cooling Scheme", IBM Tech. Bul., vol. 14, No. 2, Jul. 1971, pp. 378-379.

Primary Examiner—Patrick R. Salce
Assistant Examiner—D. L. Rebsch
Attorney, Agent, or Firm—James P. McAndrews; John A. Haug; Melvin Sharp

[57] ABSTRACT

A fan for mounting on and use in connection with cooling of components on a PWB comprising a PWB having an aperture therein for receiving a bearing holder with a bearing rotatable within the holder. An annular multipole permanent magnet is secured to the bearing for rotation in the bearing holder. An impeller in the form of radially and outwardly extending vanes, aligned with a central point but spaced from said point, is secured to an outer surface of the permanent magnet and rotates therewith. A housing is secured to the PWB, the housing being disposed over the impeller and the magnet and having two openings, one in the region above the central point of the vanes and a second opening facing along the surface of the PWB. Four electromagnets are secured to the side of the PWB opposite the magnet, the electromagnets being positioned at the four corners of a square and beneath the magnet. A nonmagnetic spacer surrounds the electromagnets with a stator positioned thereover and beneath the electromagnets, the stator being secured to the bearing holder by means of a threaded member. The electromagnets are pulsed serially by a pulse circuit disposed on the surface of the PWB, the pulses being applied to the electromagnets via conductive paths of the PWB.

11 Claims, 2 Drawing Sheets

U.S. Patent    Dec. 5, 1989    4,885,488
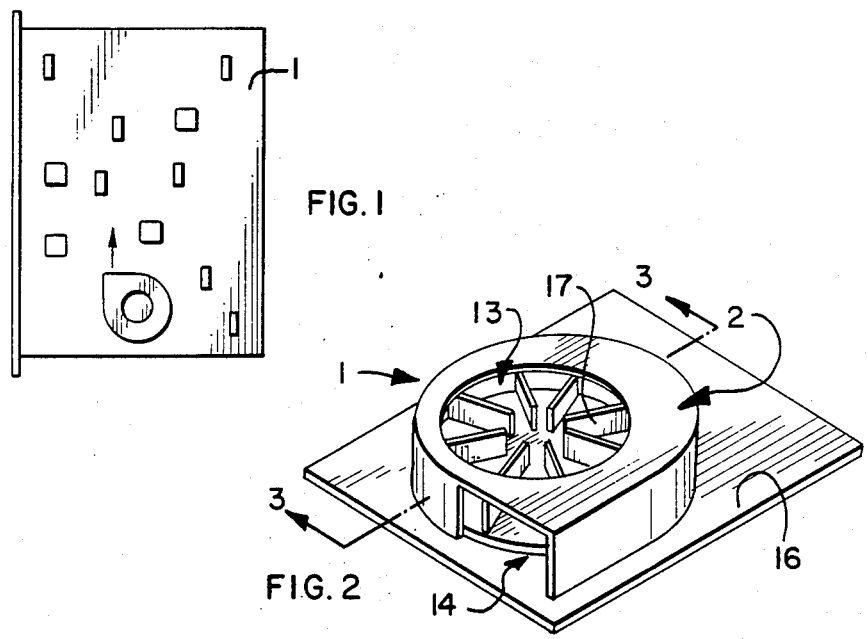
FIG. 1
FIG. 2
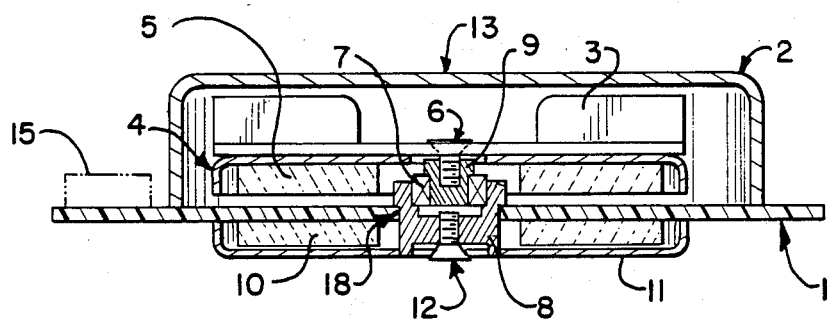
FIG. 3

MINIATURIZED FAN FOR PRINTED CIRCUIT BOARDS

BACKGROUND OF THE INVENTION

1. Field of the Invention

This invention relates to a miniaturized fan and, more specifically, to a fan capable of being mounted on a printed wiring board for cooling, primarily for cooling of electronic components on or in the immediate vicinity thereof of the printed wiring or circuit board PWB.

2. Brief Description of the Prior Art

Cooling of electronic components mounted on printed wiring boards (PWBs) is a common problem in the art. Such devices are normally cooled by fans disposed external to the PWB to enhance circuit reliability. A problem which often arises is that, where space is at a premium, the positioning of a cooling fan in close proximity to the devices to be cooled becomes a major problem. It is therefore readily apparent that cooling fans which are relatively small in size, preferably of the same order of vertical magnitude as the electronic components mounted on the PWB and which are preferably mounted on the PWB itself, are highly desirable.

SUMMARY OF THE INVENTION

In accordance with the present invention, the above noted problems of the prior art are minimized and there is provided a fan for cooling of components mounted on a PWB, said fan being of small dimension, being mounted directly onto the PWB and being under control of electronic circuitry mounted on the PWB itself.

Briefly, the above is accomplished by providing a PWB having an aperture therein for receiving a bearing holder with a bearing therein rotatable within the bearing holder. An annular multipole permanent magnet with north and south poles 120 degrees apart is secured to the bearing for rotation therewith in the bearing holder. An impeller in the form of a plurality of radially and outwardly extending vanes extending to a central point but spaced from said point is secured to an outer surface of the permanent magnet and rotates therewith. A housing is secured to the PWB, the housing being disposed over the impeller and the magnet and having two openings therein, one in the region above the central point of the vanes and a second opening facing along the surface of the PWB.

Four electromagnets are secured to the surface of the PWB opposite the magnet, the electromagnets being positioned at the four corners of a square and beneath the magnet. A non-magnetic spacer surrounds the electromagnets with a stator of a material so as not to impede rotation positioned thereover and beneath the electromagnets, the stator being secured to the bearing holder by means of a threaded member. The electromagnets are pulsed serially by a pulse circuit disposed on the surface of the PWB, the pulses being applied to the electromagnets via conductive paths of the PWB.

In operation, when current pulses are applied to the electromagnets, a magnetic field is set up to cause rotation of the rotor and impeller. The rotation of the impeller forces air therein which is between the vanes out of the second opening and along the surface of the PWB. This air movement forms a slight vacuum in the region of the impeller between the vanes and causes air to travel through the first opening to the region between the vanes. In this manner, a very thin fan is provided which causes air movement along the surface of the PWB to cool electronic components on the surface of the PWB.

BRIEF DESCRIPTION OF THE DRAWINGS

FIG. 1 is a top view of a PWB showing components mounted thereon as well as the PWB fan in accordance with the present invention;

FIG. 2 is a perspective view of a portion of the PWB fan in accordance with the present invention;

FIG. 3 is a cross sectional view of the PWB fan in accordance with the present invention taken along the line 3—3 of FIG. 2; and FIG. 4 is a bottom view of the PWB with electromagnets secured thereto.

DESCRIPTION OF THE PREFERRED EMBODIMENT

Referring first to FIG. 1, there is shown a top view of a PWB 16 with components mounted therein, these components being interconnected by wiring (not shown) of standard type and a PWB fan 1 mounted on the PWB. The fan is powered via circuitry, preferably mounted on the PWB, and serves to maintain the temperature of the components located on the PWB within desired operating levels.

Referring now to FIGS. 2 to 4, there is shown the PWB fan 1 in greater detail. The fan 1 includes a preferably plastic non-magnetic housing 2 having an air inlet aperture 13 at its top surface and an air outlet aperture 14 disposed along the surface of the non-magnetic PWB 16 of standard type for directing air along the surface of the PWB. The housing 2 is secured to the PWB 16 by means of a removably secured fastener or the like, such as a friction fitting finger disposed in an aperture formed in the PWB, to eliminate the requirement for screws.

A permanent magnet 5 in the shape of an annulus is secured to a circularly shaped solid metal rotor 4 of magnetizable material. A circularly shaped impeller 3, preferably of plastic, having a plurality of vanes 17 extending from the outer surface thereof, is secured to the outer surface of the rotor 4 and preferably has the same diameter as said rotor. The vanes 17 extend from a region spaced from the center of the impeller toward the perimeter thereof and can have some curvature, to promote increased air velocity thereover. The impeller 3 has a securing member receiving aperture at its center portion which extends through the rotor 4. A securing member 6 in the form of a threaded member extends through the receiving aperture and is threaded onto a shaft 9 to hold the impeller and rotor secured together and to the shaft. The shaft 9 is press fit into the bearing 7 which allows the rotor and the shaft to which the rotor is connected to rotate freely in the bearing. A bearing holder 8 holds the bearing 7 therein, the bearing holder being slip or friction fit into an aperture 18 therefor in the PWB 16.

A plurality of electromagnets 10 are mounted on the PWB 16 on the surface thereof remote from the permanent magnet 5 and along different radii from the center of the aperture 18 in the PWB. An embodiment of the underside of the PWB 16 with four electromagnets 10 mounted thereon is shown in FIG. 4, it being understood that the number of electromagnets used is not critical. These electromagnets are coupled via conductors on the PWB to an electronic circuit 15, preferably formed on the PWB, which controls operation of the electromagnets. Preferably, these electromagnets are pulsed consecutively around the circle. A stator 11 of magnetizable material is positioned over the electromagnets 10, the stator having an aperture through the center thereof for receiving a threaded member 12, the threaded member securing the stator to the bearing holder 8 via a threaded member receiving aperture in the bearing holder.

In operation, the electromagnets 10 are pulsed consecutively around the circle by the electronic driver circuit 15 to produce a rotating magnetic field. This rotating magnetic field causes the permanent magnet 5 to commence rotation in a clockwise direction as shown in FIG. 2. The rotation of the magnet 5 causes the rotor 4 and impeller 3 to rotate, thereby causing air to be expelled from the housing outlet 14 at substantial velocity and causing air to be forced into the housing through housing inlet 13 to replace the expelled air. The air exiting the housing 2 via the outlet 14 is accelerated by the impeller due to the speed of the vane rotation as well as due to the vane curvature to provide cooling of equipment in the path of the accelerated air.

It can be seen that there is provided a fan for cooling components on a PWB which is of simple design, which is capable of being mounted on a PWB along with the drive circuitry therefor and which is capable of being fabricated with sufficiently small height dimension to fit into regions not readily accessible to cooling by prior art systems.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A cooling fan for a PWB comprising:
   a plurality of electromagnets adapted to be mounted closely adjacent and spaced from one surface of a PWB;
   a rotatably mounted permanent magnet means adapted to be mounted adjacent an opposing surface of the PWB in magnetically couplable relation with said electromagnets to be movable in response to magnetic fields established by the electromagnets for receiving air and expelling said air at increased speed; and
   means adapted to be secured in said PWB for rotatably mounting said rotatably mounted permanent magnet thereon at said opposing PWB surface and for mounting said electromagnets thereon at said one PWB surface in said magnetically couplable relation.

2. A cooling fan system for electronic circuit components comprising a PWB having the electronic components thereon; a plurality of electromagnets mounted closely adjacent and spaced from one surface of the PWB; a rotably mounted permanent magnet means adapted to be mounted adjacent an opposing surface of the PWB in magnetically couplable relation with the electromagnets to be movable in response to magnet fields established by the electromagnets for receiving air and expelling air at increased speed; means secured in the PWB rotably mounting the rotably mounted permanent magnet thereon at said opposing PWB surface and mounting the electromagnets at said one PWB surface in said magnetically couplable relation; and a vaned impeller secured to said permanent magnet for receiving and expelling said air.

3. A cooling fan as set forth in claim 2 further including a rotor magnetizable material disposed over said permanent magnet and secured to said means for mounting.

4. A cooling fan as set forth in claim 3 further including a housing secured to said PWB and having an air inlet adjacent said rotatable magnet, said air inlet having an axis parallel to the axis of rotation of said rotatable magnet and an air outlet extending along said opposing surface and in a direction normal to said axis.

5. A cooling fan as set forth in claim 2 wherein said PWB includes an aperture for receiving said means secured in said PWB for rotatably mounting said rotatably mounted permanent magnet therein, said means secured including a bearing member secured in said aperture and means rotatable in said bearing member and secured to said permanent magnet for rotation of said permanent magnet.

6. A cooling fan as set forth in claim 3 wherein said PWB includes an aperture for receiving said means secured in said PWB for rotatably mounting said rotatably mounted permanent magnet therein, said means secured including a bearing member secured in said aperture and means rotatable in said bearing member and secured to said permanent magnet for rotation of said permanent magnet.

7. A cooling fan as set forth in claim 4 wherein said PWB includes an aperture for receiving said means secured in said PWB for rotatably mounting said rotatably mounted permanent magnet therein, said means secured including a bearing member secured in said aperture and means rotatable in said bearing member and secured to said permanent magnet for rotation of said permanent magnet.

8. A cooling fan as set forth in claim 1 further including a magnetizable stator secured over and magnetically coupled to said electromagnets.

9. A cooling fan as set forth in claim 4 further including a magnetizable stator secured over and magnetically coupled to said electromagnets.

10. A cooling fan as set forth in claim 1 further including a magnetizable stator secured over and magnetically coupled to said electromagnets.

11. A cooling fan as set forth in claim 7 further including a magnetizable stator secured over and magnetically coupled to said electromagnets.

* * * * *